United States Patent [19]

Gose

[11] Patent Number: 4,866,399
[45] Date of Patent: Sep. 12, 1989

[54] NOISE IMMUNE CURRENT MIRROR

[75] Inventor: Mark W. Gose, Kokomo, Ind.

[73] Assignee: Delco Electronics Corporation, Kokomo, Ind.

[21] Appl. No.: 261,550

[22] Filed: Oct. 24, 1988

[51] Int. Cl.⁴ .............................................. H03F 1/30
[52] U.S. Cl. .................................... 330/288; 330/149
[58] Field of Search ............... 330/149, 288, 297, 307; 323/315, 316

[56] References Cited

U.S. PATENT DOCUMENTS

| 3,886,435 | 5/1975 | Steckler | 323/4 |
| 3,925,718 | 12/1975 | Wittlinger | 323/4 |
| 4,103,249 | 7/1978 | Burdick | 330/288 |
| 4,413,226 | 11/1983 | Davies | 323/303 |
| 4,435,678 | 3/1984 | Joseph et al. | 323/273 |
| 4,536,662 | 8/1985 | Fujii | 330/288 X |
| 4,546,307 | 10/1985 | Llewellyn | 323/315 |
| 4,578,633 | 3/1986 | Aoki | 323/315 |
| 4,603,290 | 7/1986 | Shinomiya | 323/315 |

Primary Examiner—Steven Mottola
Attorney, Agent, or Firm—Tim G. Jaeger

[57] ABSTRACT

A conventional PNP transistor current mirror provides identical first and second reference currents each containing the same noise component (which may be due to high frequency supply voltage variations). An input current is subtracted from the first reference current to provide a difference current containing the noise component in the first reference current. An NPN current mirror subtracts the difference current from the second reference current such that the noise component in the difference current cancels the noise component in the second reference current to provide an output current which is an identical "mirror image" of the input current and which is free of the cancelled noise component.

5 Claims, 3 Drawing Sheets

NOISE IMMUNE CURRENT MIRROR

This invention relates to a current mirror circuit. More particularly, the invention relates to a circuit for providing current mirror operation with enhanced noise immunity.

A conventional current mirror is a transistor circuit which produces one or more output currents each of which is a "mirror image" of an input current, i.e., each output current is in the same direction as the input current (either both into the mirror circuit or both out of the mirror circuit) and each output current is ratioed to the input current (1:1, n:1, or 1:n). Although current mirrors can be constructed with discrete transistors, they are most widely utilized within integrated circuits where the required matching relationships between the transistor devices are more readily effected through integrated circuit processing techniques. Nevertheless, the present invention may be practiced in discrete circuit form as well as integrated circuit form.

In a conventional current mirror, a problem can arise in that the current mirror may become a source of noise, meaning that a noise component not present in the input current appears in the output current. As an example, the noise component may be generated by high frequency variations in the supply voltage. This particular source of noise is especially prevalent in integrated circuit current mirrors composed of "lateral" PNP transistor structures, due to the finite bandwidth and parasitic junction capacitances of such devices. The present invention provides a solution to this problem.

According to one aspect of the invention, a conventional current mirror is utilized to generate first and second identical reference currents each containing the same noise component. An input current is then subtracted from the first reference current to provide a difference current including the noise component. Next, the difference current is subtracted from the second reference current to provide an output current which is an identical "mirror image" of the input current. Advantageously, in the latter subtraction process, the noise component in the difference current cancels the noise component in the second reference current so that the output current is free of the noise component.

In another aspect of the invention, the input current and/or the difference current are subtracted from the first and second reference currents, respectively, through the action of a conventional current mirror employing transistors of a conductivity type opposite to the conductivity type of the transistors employed in the current mirror utilized to generate the first and second reference currents. In one embodiment, the invention is realized within a bipolar integrated circuit in which the first and second reference currents are provided by a PNP transistor current mirror and the difference current is subtracted from the second reference current by an NPN transistor current mirror so as to provide a PNP current mirror operation with NPN current mirror noise immunity (which is inherently superior to PNP current mirror noise immunity, assuming "lateral" PNP structures).

These and other aspects and advantages of the invention may be best understood by reference to the following detailed description when taken in conjunction with the accompanying drawing in which:

FIGS. 1A, 1B, 1C, 1D, 1E, and 1F are schematic diagrams of conventional current mirrors useful in respect to the invention.

Referring to FIGS. 1A through 1F, there are shown six common current mirror configurations. For purposes of illustration, PNP transistors are employed in each configuration. However, it is to be understood that NPN transistors could alternately be employed. In addition, other current mirror configurations are also possible.

Each of the FIGS. 1A through 1F current mirror configurations includes an input leg and output leg (separated by a dashed line for purposes of illustration). Assuming that the transistors have matched characteristics, the imposition of an input current Ii in the input leg results in the development of a "mirror image" output current Io in the output leg. Additional output currents Io can be developed by simply replicating the output leg of the given current mirror configuration.

In the conventional current mirror configurations of FIGS. 1A through 1F (as well as in other possible current mirror configurations) a problem can arise in that the output current Io may contain a noise component not present in the input current Ii. One source of such noise may be high frequency variations or perturbations in the supply voltage Vs which are translated into the output current Io by the transistors employed in the current mirror. This problem is especially manifest in integrated circuit current mirrors employing "lateral" PNP transistors at supply voltage variations exceeding about 200 KHz (because of the limited bandwidth and parasitic junction capacitances of the PNP devices). The present invention offers a remedy for this problem.

Figure 2:
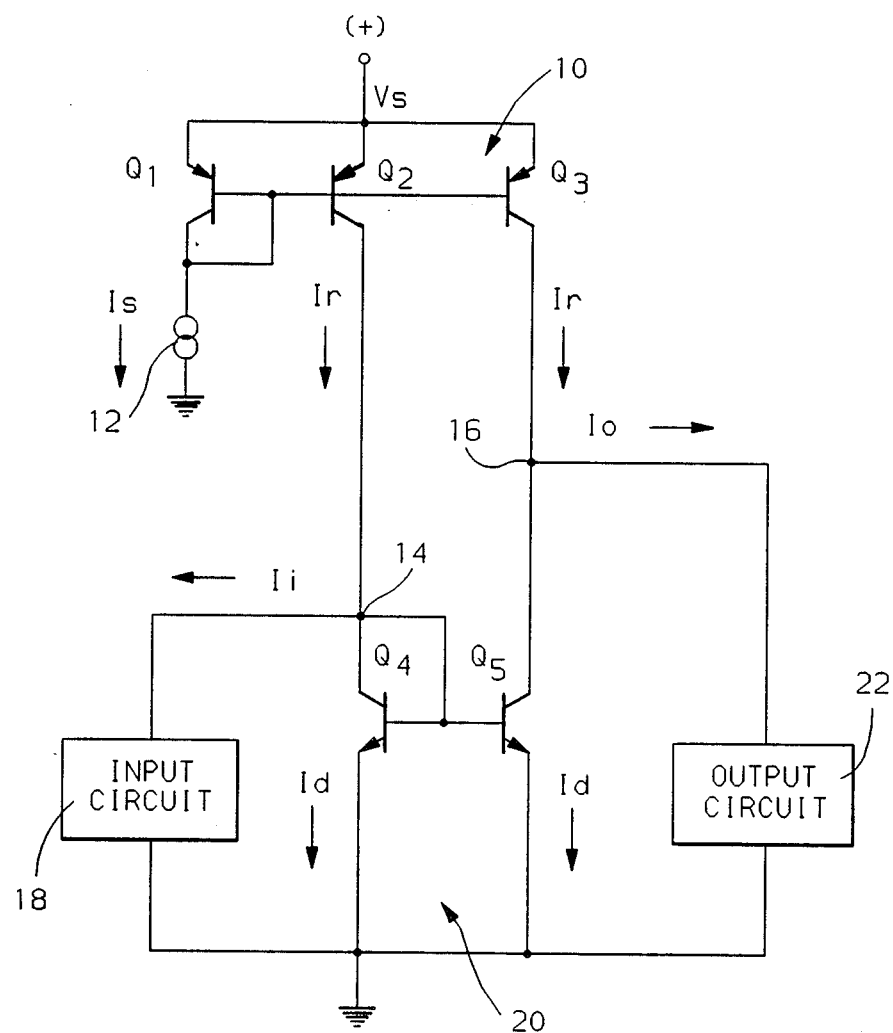
FIG. 2 is a combined schematic and block diagram of one embodiment of the invention.

Referring to FIG. 2, a conventional current mirror 10 includes PNP transistors Q1, Q2 and Q3. Transistor Q1 is connected as a diode which forms the input leg of the current mirror 10. The diode Q1 is connected in series with a current sink 12 which establishes a sink current Is as the input current of the mirror 10. Transistors Q2 and Q3 form dual output legs of the current mirror 10 for providing first and second reference currents Ir as the output currents of the mirror 10. Owing to the current mirror action of the circuit 10, the output reference currents Ir are proportional (and may be identical) to the input sink current Is. The characteristics of transistors Q2 and Q3 are matched so that the reference currents Ir are identical to each other—meaning that each of the reference currents Ir contains the same identical noise component, including in particular the same noise component due to high frequency variations in the supply voltage Vs as previously explained.

The first and second reference currents Ir are applied to first and second summing nodes 14 and 16, respectively. An input circuit 18 is connected to the first summing node 14 for withdrawing an input current Ii from the first summing node 14 so as to subtract the input current Ii from the reference current Ir to leave a difference current Id flowing from the node 14. Importantly, the difference current Id includes the noise component contained in the first reference current Ir. It is implicit in the foregoing that the reference currents Ir must exceed the input current Ii.

A current mirror 20, composed of matched NPN transistors Q4 and Q5, is responsive to the difference current Id issuing from the first summing node 14 to withdraw the same difference current Id from the second summing node 16 so as to subtract the difference current Id from the second reference current Ir to leave an output current Io which flows from the node 16 into an output circuit 22. As a result of this latter subtraction process, the noise component in the difference current Id cancels the noise component in the second reference current Ir so that the output current Io is free of the cancelled noise component.

It will be noted that the output current Io is opposite in direction to the input current Ii, i.e., the output current is a "mirror image" of the input current. Accordingly, the circuit of FIG. 2 acts as a true current mirror. One use for such a mirror circuit is as a constant current source.

Figure 3A:
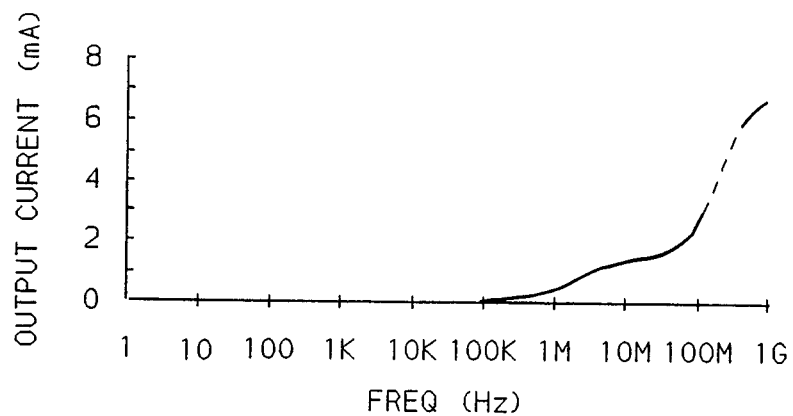
FIGS. 3A and 3B are graphs depicting the noise immunity improvement brought about by the FIG. 2 embodiment of the invention.
Figure 3B:
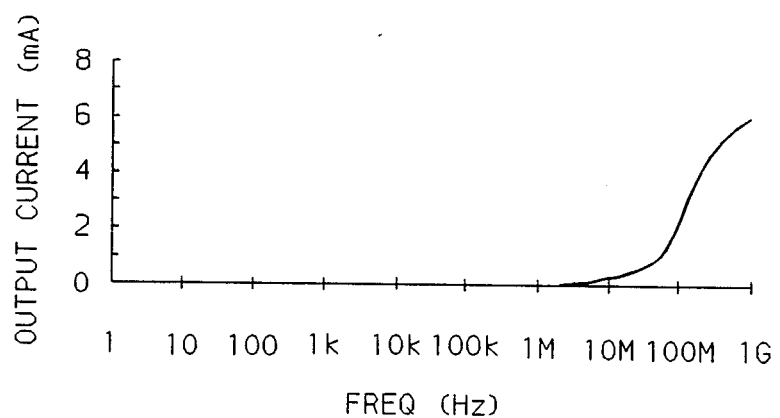

Advantageously, the FIG. 2 circuit has enhanced immunity to noise, including noise generated by high frequency variations in the supply voltage Vs. FIGS. 3A and 3B depict the results of computer simulations of the output current response of the PNP current mirror 10 to high frequency variations in the supply voltage Vs, both without the invention (FIG. 3A) and with the invention (FIG. 3B). Note that the frequency at which noise begins to increase significantly in the output current is more than two orders of magnitude higher with the invention than without the invention. This is due in large part to the higher bandwidth of the NPN transistors in the current mirror 20 as compared to the PNP transistors in the current mirror 10 (assuming fabrication in accordance with common bipolar integrated circuit techniques). In effect, the circuit of FIG. 2 provides PNP current mirror operation with NPN current mirror noise immunity.

Figure 1A:
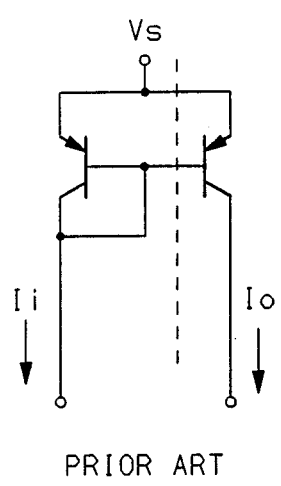
Figure 1B:
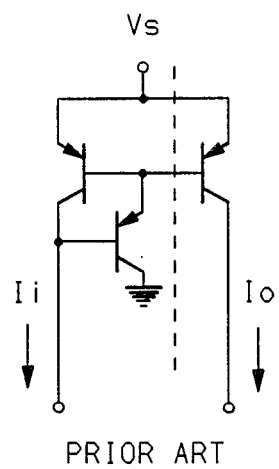
Figure 1C:
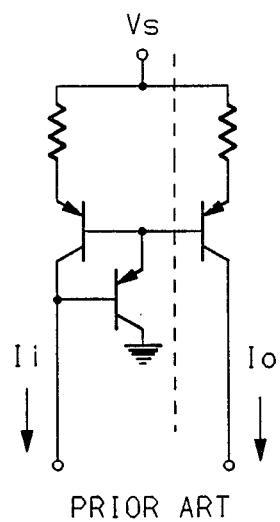
Figure 1D:
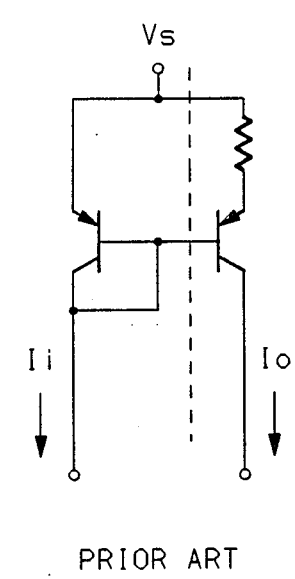
Figure 1E:
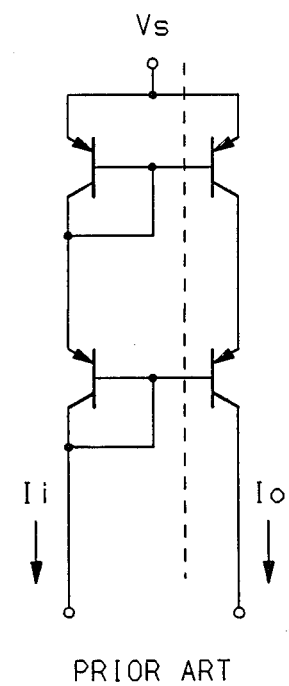
Figure 1F:
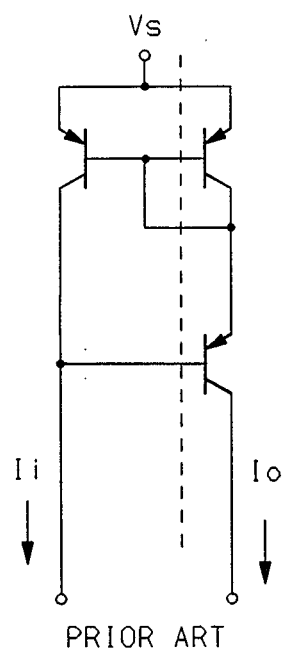

It will be noted that the current mirror 20 is the NPN transistor counterpart of the PNP transistor current mirror illustrated in FIG. 1A. However, it is to be understood that the current mirror 20 could just as well be the NPN transistor counterpart of one of the FIGS. 1B through 1F configurations, or some other current mirror circuit. Further, it will be appreciated that the input circuit 18 may also comprise an NPN transistor current mirror if desired.

The foregoing embodiments are intended to illustrate the invention and not to unduly limit it. Various alterations and modifications to these embodiments are possible within the spirit and scope of the invention as defined by the appended claims.

What is claimed is:

1. A noise immune current mirror comprising:
   means for providing first and second reference currents each containing a noise component;
   means for subtracting an input current from the first reference current to provide a difference current containing the noise component in the first reference current; and
   means for subtracting the difference current from the second reference current such that the noise component in the difference current cancels the noise component in the second reference current to provide as output current which is a "mirror image" of the input current and which is free of the cancelled noise component.

2. A noise immune current mirror comprising:
   means for providing identical first and second reference currents each containing the same noise component;
   means for subtracting an input current from the first reference current to provide a difference current containing the noise component in the first reference current; and
   means for subtracting the difference current from the second reference current such that the noise component in the difference current cancels the noise component in the second reference current to provide an output current which is an identical "mirror image" of the input current and which is free of the cancelled noise component.

3. A noise immune current mirror comprising:
   means including a current mirror for providing identical first and second reference currents each containing the same noise component;
   means for subtracting an input current from the first reference current to provide a difference current containing the noise component in the first reference current; and
   means for subtracting the difference current from the second reference current such that the noise component in the difference current cancels the noise component in the second reference current to provide an output current which is an identical "mirror image" of the input current and which is free of the cancelled noise component.

4. A noise immune current mirror comprising:
   means including a current mirror composed of transistors of one conductivity type for providing identical first and second reference currents each containing the same noise component;
   means for subtracting an input current from the first reference current to provide a difference current containing the noise component in the first reference current; and
   means including a current mirror composed of transistors of the opposite conductivity type for subtracting the difference current from the second reference current such that the noise component in the difference current cancels the noise component in the second reference current to provide an output current which is an identical "mirror image" of the input current and which is free of the cancelled noise component.

5. A noise immune current mirror for a bipolar integrated circuit comprising:
   means including a PNP transistor current mirror for providing identical first and second reference currents each containing the same noise component due to high frequency supply voltage variations;
   means for subtracting an input current from the first reference current to provide a difference current containing the noise component in the first reference current; and
   means including a NPN transistor current mirror for subtracting the difference current from the second reference current such that the noise component in the difference current cancels the noise component in the second reference current to provide an output current which is an identical "mirror image" of the input current and which is free of the cancelled noise component.

* * * * *